United States Patent
Sugino et al.

(10) Patent No.: US 7,135,358 B2
(45) Date of Patent: Nov. 14, 2006

(54) PROCESS FOR PRODUCING RESIN-SEALED TYPE ELECTRONIC DEVICE

(75) Inventors: Takashi Sugino, Phoenix, AZ (US); Tomonori Shinoda, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/948,164

(22) Filed: Sep. 24, 2004

(65) Prior Publication Data

US 2005/0074922 A1    Apr. 7, 2005

(30) Foreign Application Priority Data

Oct. 1, 2003   (JP)   ............................. 2003-342932

(51) Int. Cl.
*H01L 21/44*   (2006.01)
(52) U.S. Cl. ............... 438/126; 257/667; 257/E23.116; 257/E21.499
(58) Field of Classification Search ........ 438/106–127, 438/612–617; 257/666–674, 701–705, 729–733, 257/E23.116, E21.499
See application file for complete search history.

(56) References Cited

U.S. PATENT DOCUMENTS 6,444,499 B1 * 9/2002 Swiss et al. ................. 438/127
2003/0173655 A1 * 9/2003 Rissing et al. .............. 257/667

FOREIGN PATENT DOCUMENTS

JP            09301480 A   *  11/1997

* cited by examiner

*Primary Examiner*—Brook Kebede
(74) *Attorney, Agent, or Firm*—Oblon, Spivak, McClelland, Maier & Neustadt, P.C.

(57) ABSTRACT

There is disclosed a process for producing a resin-sealed type electronic device which comprises forming a dam frame on edge and side portions of a substrate loaded with a single or a plurality of electronic elements so as to encompass the electronic elements by sticking down a pressure sensitive adhesive sheet to the substrate, pouring a resin for sealing in the inside of the dam frame, and heat-curing the poured resin. The process dispenses with an intricate production step or a long time in forming the dam frame, thus enabling forming of the same with a minimized number of production steps and in the shortest amount of time possible.

20 Claims, 4 Drawing Sheets

US 7,135,358 B2

PROCESS FOR PRODUCING RESIN-SEALED TYPE ELECTRONIC DEVICE

BACKGROUND OF THE INVENTION

1. Field of the Invention

The present invention relates to a process for producing a resin-sealed type electronic device which comprises forming a dam frame on a substrate loaded with at least one electronic element so as to encompass the electronic element, pouring a resin for sealing in the inside of the dam frame, and heat-curing the poured resin.

2. Description of the Related Arts.

In general, semiconductor chips and integrated circuits (IC), etc. that are constituted of internally contained semiconductor chips are employed as a resin-sealed electronic devices.

For the resin sealing, there is prevalently used a method which comprises housing a substrate loaded with an electronic element in a cavity of a die, and transfer injection molding a resin for sealing. However, the above-mentioned method involves such problems as requiring much expense for equipment such as dies, and in particular being difficult to cope with small lots and multi-item manufacture.

Conversely as a method easy to cope with small lots and multi-item manufacture, there is carried out a method which comprises forming a dam frame on a substrate loaded with at least one electronic element so as to encompass the electronic element, pouring a low viscosity resin for sealing in the inside of the dam frame, and heat-curing the poured resin.

The dam frame in the method is intended to prevent the resin for sealing from leaking out therefrom, and is usually formed by coating prescribed portions with a leakage preventive material composed of a high viscosity resin for sealing and/or a sealant, and heat-curing the material {for instance, refer to Patent Literature 1: Japanese Patent Application Laid-Open No. 124401/2003 (Heisei 15)}.

However the method just mentioned involves the problem of intricate steps of applying a leakage preventive material and heat-curing the same, increased number of steps, requiring a long time for heat-curing, and also requiring a long time up to the formation of the dam frame, and in turn for the entire steps.

SUMMARY OF THE INVENTION

An object of the present invention is to eliminate the above-mentioned difficulties in the prior arts, and at the same time provide a process for producing a resin-sealed type electronic device which process dispenses with intricate steps or a long time for the formation of the dam frame.

Under such circumstances, as the result of intensive extensive research and investigation made by the present inventors, it has been found that the above-mentioned problems can be solved through the formation of a dam frame by sticking down a pressure sensitive adhesive (hereinafter referred to as PSA) sheet. The present invention has been accomplished by the foregoing findings and information.

Specifically, the present invention pertains to the following.

1. A process for producing a resin-sealed type electronic device which comprises forming a dam frame on a substrate loaded with an electronic element so as to encompass the electronic element by sticking down a PSA sheet to the substrate, pouring a resin for sealing in the inside of the dam frame, and heat-curing the poured resin.

2. A process for producing a resin-sealed type electronic device which comprises forming a dam frame on edge and side portions of a substrate loaded with a plurality of electronic elements so as to encompass the electronic elements as a whole by sticking down a PSA sheet to the substrate, pouring a resin for sealing in the inside of the dam frame, heat-curing the poured resin, and subsequently cutting and separating the elements into each unit electronic device by means of dicing.

3. The process for producing a resin-sealed type electronic device as set forth in the preceding item 2, which further comprises polishing and smoothing the surfaces of the cured resin for sealing prior to the dicing.

4. The process for producing a resin-sealed type electronic device as set forth in any of the preceding items, wherein use is made of a PSA sheet that has been formed into the shape of the dam frame.

5. The process for producing a resin-sealed type electronic device as set forth in any of the preceding items, wherein the PSA sheet comprises a base material layer and a PSA layer.

6. The process for producing a resin-sealed type electronic device as set forth in the preceding item 5, wherein the base material layer comprises a foamed film layer of a thermoplastic resin.

Figure 1:
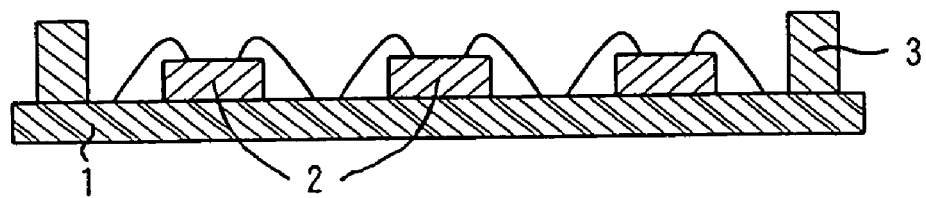
FIG. 1 is a cross sectional view illustrating the state of having formed a dam frame on edge and side portions of a substrate loaded with a plurality of electronic elements.

The numerical symbols shall have the following designation.

1: substrate,
2: electronic element,
3: dam frame,
4: resin for sealing

DESCRIPTION OF THE PREFERRED EMBODIMENTS

In the following, the present invention will be described in detail.

In the present invention, the resin-sealed type electronic device means a semiconductor chip itself and an electronic material in which an electronic element such as an integrated circuit (IC) that is constituted of internally contained semiconductor chips, and is sealed with a resin, while the substrate means to include not only a resinous substrate but also a ceramic substrate.

On the other hand, the PSA sheet which is used for forming a dam frame comprises a base material layer and a PSA layer.

For the purpose of curing the resin for sealing which has been poured in the inside of the dam frame, heating is carried out usually at a temperature in the range of 150 to 200° C. for 1 to 10 hours. Since the PSA sheet needs to be capable of retaining its shape until the resin for sealing in the vicinity of the dam frame is cured to some extent and loses its fluidity, it is preferable to select the base material layer and PSA layer taking the foregoing into consideration.

It being so, the materials constituting the base material layer are exemplified by resinous materials such as polyester, acrylic resin, polyolefin, polyvinyl chloride and fluororesin and rubber materials such as fluorine rubber, acrylic rubber and butyl rubber.

The base material layer is not limited to the above-mentioned filmy layer, but may be a foam of any of polyurethane, polyethylene, polypropyle, polyester and fluororesin or non-woven fabric.

In particular, in the case where the base material layer is composed of foam, when the resin for sealing poured in the inside of the dam frame is heat-cured, the base material layer is thinned due to its volume reduction and the dam frame becomes lower than the height of the layer of the cured resin. Thus as described hereinafter, in the case of polishing and smoothing the surfaces of the cured resin, the dam frame favorably need not be removed.

The cause for thinned base material layer composed of foam by volume reduction is considered to be due to the gases in the foam released by heating. Of the foam which is divided into a closed cell foam and an open cell foam, a closed cell foam is preferably used in the base material layer for the PSA sheet as the dam frame because of its being less prone to cause the leakage of the resin for sealing. The expansion ratio of the closed cell foam is preferably in the range of 5 to 50, approximately.

Examples of the usable PSA agent constituting the PSA layer is not specifically limited provided that the aforesaid requirements are satisfied, but are exemplified by PSA agents of acrylic base, rubber base, silicone base and polyurethane base, of which acrylic base PSA agent is usually preferable owing to its inexpensiveness and having moderate heat resistance.

The acrylic base PSA agent is constituted of a copolymer composed of an acrylic monomer as a principal ingredient. Examples of the acrylic monomer include, for instance, an alkyl ester of (meth)acrylic acid exemplified by methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate and tert-butyl (meth)acrylate. The acrylic base PSA agent may be a copolymer with a monomer bearing a functional group such as 2-hydroxyethyl acrylate or with a monomer other than an acrylic base such as vinyl acetate.

The PSA layer may comprise a hardenable PSA agent in which the above-exemplified PSA agent is blended with a thermosetting resin such as epoxy resin. The use of a hardenable PSA agent in the PSA layer results in the simultaneous curing of the resin for sealing together with the PSA layer, thereby preventing the softening of the PSA layer by the migration of low molecular weight components contained in the resin for sealing and the base material layer. The softening of the PSA layer, if such takes place at the time of the curing of the resin for sealing, brings about a fear of causing a dislocation and/or a peeling in the steps of polishing and dicing thus leading to the cause for pollution.

The PSA agent to be used in the PSA layer is divided into a permanent adhesion type and a removable type according to the adhesion. In the case where the base material layer to be used in the PSA sheet comprises the above-cited foam, the dam frame need not be peeled off, and therefore the PSA layer may be any of a permanent adhesion type and removable type, however, is preferably selected from the permanent adhesion type so as not to give rise to falling out or dislocation of the dam frame at the time of heat-curing the resin for sealing. In the case where the base material layer is not composed of foam, the removable type is preferably selected, since the dam frame is removed after the heat-curing of the resin for sealing.

The thickness of the PSA layer is preferably 5 to 100 μm, particularly 10 to 50 μm.

The dam frame, which is intended to prevent the resin for sealing from leaking out, needs to be comparable to or a little higher than the thickness of the resin for sealing that is to be provided. Accordingly, the thickness of the PSA sheet as a whole including the PSA layer having the aforesaid thickness is properly optionally selected in accordance with the height of the dam frame that is to be provided, and is usually in the range of 500 μm to 5 mm.

The present invention is also applied to the case of forming a dam frame on edge and side portions of a substrate loaded with a plurality of electronic elements so as to encompass the electronic elements in whole, pouring a resin for sealing in the inside of the dam frame, heat-curing the poured resin, and subsequently cutting and separating the elements into each unit electronic device by means of dicing, in addition to the case of forming a dam frame on a substrate loaded with a single or a plurality of electronic elements individually for each of the electronic elements, pouring a resin for sealing in the inside of each of the dam frames, and heat-curing the poured resin.

In the above-mentioned case of sealing a plurality of electronic elements with a resin and thereafter cutting and separating the elements into each united electronic device by means of dicing, (i.e., sawing or otherwise machining a member so as to form small squares or dices), it is preferable to polish (i.e. to polish the surface with an a brasive) and smooth (i.e. to form a level or continuously even surface) the surfaces of the cured resin for sealing prior to the dicing, whereby the quality of the cut and separated individual electronic device can be made constant.

As described hereinbefore, in the case where foam is used as the base material layer of the PSA sheet, when the resin for sealing poured in the inside of the dam frame is heat-cured, the base material layer is thinned due to its volume reduction and the dam frame becomes lower than the height of the layer of the cured resin for sealing. Thus in the case of polishing and smoothing the surfaces of the cured resin, the dam frame need not be removed to great advantage.

In the following, detailed description will be given, with reference to the drawings, of an example in which the process of the present invention is applied to the case of forming a dam frame on edge and side portions of a substrate loaded with a plurality of electronic elements so as to encompass the electronic elements in whole, pouring a resin for sealing in the inside of the dam frame, heat-curing the poured resin, and subsequently cutting and separating the elements into each unit electronic device by means of dicing.

Figure 2:
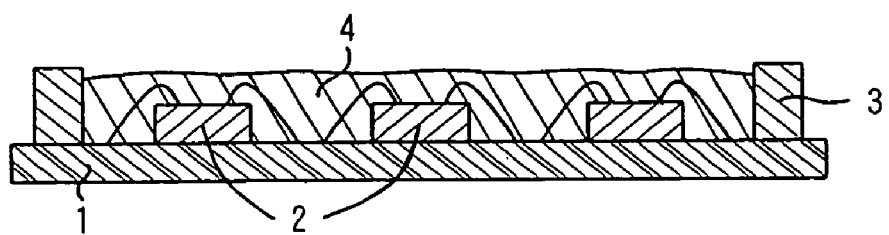
FIG. 2 is a cross sectional view illustrating the state of having poured a resin for sealing in the inside of the dam frame under the condition as illustrated on FIG. 1.
Figure 3:
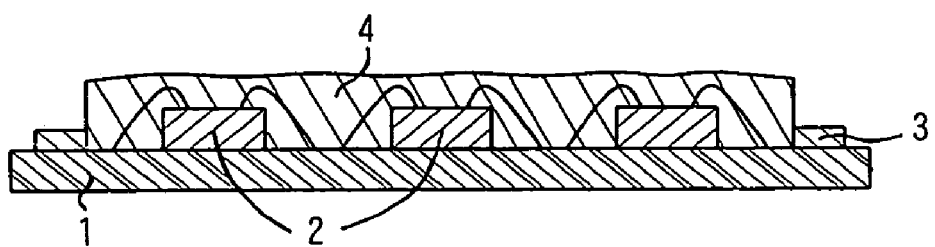
FIG. 3 is a cross sectional view illustrating the state of having heat-cured the resin for sealing under the condition as illustrated on FIG. 2, whereby the dam frame is thinned due to volume reduction.

FIGS. 1 to 3 are each a cross sectional view illustrating the steps of sealing with a resin, a plurality of electronic elements that are mounted on a substrate.

In the first place as illustrated on FIG. 1, a dam frame is formed by sticking down a PSA sheet to edge and side portions of a substrate 1 loaded with a plurality of electronic elements 2.

Subsequently as illustrated on FIG. 2, a resin for sealing 4 is poured in the inside of the dam frame, and then heat-cured the same.

The resin for sealing and heat-curing conditions are not specifically limited, and there are applicable thereto, the resin for sealing and heat-curing conditions that are usually used for the purpose of this kind.

In the case of using the PSA sheet in which the base material layer is composed of a material other than foam, since the dam frame is substantially free from deformation even under heating, the cross sectional configuration thereof on FIG. 2 remains substantially unchanged. As mentioned hereinbefore in the case of using the PSA sheet in which the base material layer is composed of foam, the base material layer is thinned by volume reduction under heating, whereby the dam frame 3 becomes lower in height than the height of the heat-cured resin for sealing 4 as illustrated in FIG. 3.

Although not illustrated on the drawings, the resin for sealing is heat-cured, and thereafter the elements are cut and separated into each unit electronic device by means of dicing.

The thicknesses of the heat-cured resin for sealing sometimes include dispersion to some extent depending upon the portion and position, and it is preferable in this case to polish and smooth the surfaces of the cured resin for sealing prior to dicing.

In the case where the cross sectional configuration of the dam frame in FIG. 2 remains substantially unchanged even under heat-curing, the dam frame becomes an obstacle to polishing, thereby necessitating removal of the same prior to the polishing. Conversely in the case where the dam frame is lower than the height of the heat-cured resin for sealing as illustrated on FIG. 3, the dam frame need not be removed.

Figure 4:
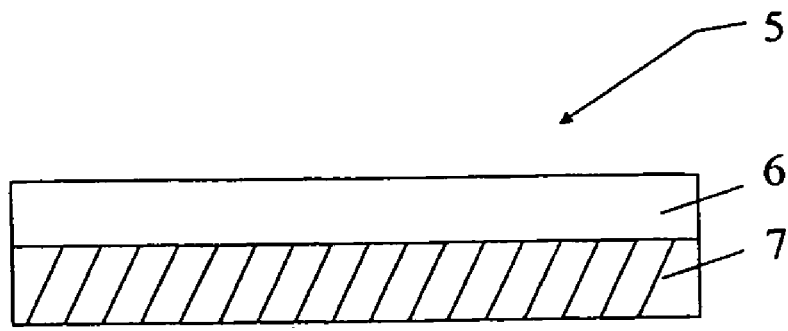
FIG. 4 shows the structure of the dam.

FIGS. 1 to 3, which are each a cross sectional view illustrating the steps of sealing with a resin, a plurality of electronic elements that are mounted on a substrate, are substantially identical with the case of forming a dam frame on a substrate loaded with a single or a plurality of electronic elements individually for each of the electronic elements, pouring a resin for sealing in the inside of each of the dam frames, and heat-curing the poured resin, except for the difference of the dam frame being formed in a state of encompassing one electronic element. FIG. 4 illustrates that the dam frame 3 may comprises a pressure sensitive adhesive sheet 5 formed of a base material layer 6 and a pressure sensitive adhesive layer 7.

In the case of forming the dam frame with the PSA sheet, it is preferable from the aspect of workability to stick down a PSA sheet which has been formed in advance into a prescribed shape (in the form of a window frame) to the substrate.

The dam frame need only be formed so as to encompass the electronic element. Likewise in the case of forming a dam frame on edge and side portions of a substrate loaded with a plurality of electronic elements, the dam frame may be installed at a distance inwardly from the edge and side portions of a substrate.

In summarizing the working effects of the process for producing a resin-sealed type electronic device, the process dispenses with intricate steps or a long time for the formation of the dam frame, thereby enables one to produce a resin-sealed type electronic device with a minimized number of production steps and a shortest time, and is particularly well suited for small lots and multi-item manufacture of electronic devices requiring sealing with a resin.

In the following discussion, the present invention will be described in greater detail with reference to working examples.

EXAMPLE 1

A. Formation of Dam Frame

A dam frame was formed by sticking down a PSA sheet to edge and side portions of a substrate loaded with a plurality of electronic elements as illustrated on FIG. 1.

The substrate used therein was a ceramic substrate measuring 94 mm ×94 mm square and 1 mm in thickness, and 21×11 numbers of electronic elements measuring 3.0 mm×7.0 mm and 400 µm in thickness were each arranged at an equal interval on the central portion of the substrate (80 mm×80 mm square) excluding a width of 7.0 mm from each of the edge and side portions. The electronic elements were each subjected to bonding, and had a height of about 500 µm including bonding wires. As the base material layer for the PSA sheet, use was made of 3 mm thick polypropylene foam (manufactured by Sekisui Chemical Co., Ltd. under the trade name Softlon SP #2003, closed cell type with an expansion ratio of 25).

A releasing film made of 38 µm thick polyethylene terephthalate was coated on the releasing treatment face with an acrylic base PSA agent of permanent adhesion type (butyl acrylate/2-hydroxyethyl acrylate being 91/ 9 parts by weight and isocyanate based cross-linking agent being 2.2 parts by weight) so that the dry layer thickness is made to be 20 µm. Thus the resultant coated film on the PSA layer side was laminated on one side of the above base material layer to prepare a PSA sheet.

The resultant PSA sheet was punched into a shape of window frame containing an outer frame measuring 84 mm×84 mm square with 2 mm in width, and an inner frame measuring 80 mm×80 mm square with 2 mm in width to prepare a dam frame.

The dam frame thus obtained was, after removing the releasing film, stuck down to the above-mentioned ceramic substrate so that the centers of the substrate and dam frame coincided with each other. (The dam frame was installed at an equal distance inwardly from the edge and side portions of the substrate.)

B. Pouring and Heat-curing of Resin for Sealing

A resin for sealing (manufactured by Sumitomo Bakelite Co., Ltd. under the trade name: CRP-3150) was poured in the inside of the dam frame thus formed up to a thickness of 2 mm so as to result in the state as illustrated on FIG. 2.

Subsequently the dam frame with the resin was placed in a curing oven, and heated at 175° C. for 5 hours to cure the resin for sealing.

C. Cutting and Separation into Unit Electronic Device

By the heating treatment, the dam frame was thinned to a height of 1 mm or less due to volume reduction, and was made lower than the thickness of the cured resin for sealing (1.8 to 2.0 mm). Accordingly the surfaces of the cured resin for sealing were polished and smoothed without removing the dam frame.

Thereafter the product was cut and separated into each of unit electronic device by means of dicing. The dicing was put into practice through a definite method by sticking the device and fixing to a dicing tape.

EXAMPLE 2

The procedure in Example 1 was repeated to obtain electronic devices except that in a PSA sheet, use was made of a base material layer composed of 3 mm thick polyethylene foam (manufactured by Sekisui Chemical Co., Ltd.

under the trade name Softlon NF #3003, closed cell type with an expansion ratio of 30).

EXAMPLE 3

The procedure in Example 1 was repeated to obtain electronic devices except that in a PSA sheet, use was made of a base material layer composed of 3 mm thick polyurethane foam (manufactured by Toyo Quality One Co., Ltd. under the trade name C-lite N-2830G, open cell type).

EXAMPLE 4

In a PSA sheet, use was made of a base material layer composed of 3 mm thick non-foamed polyvinyl chloride sheet (manufactured by Mitsubishi Chemical MKV Company under the trade name: Vinycasheet). The PSA layer was a layer which had a dry film thickness of 20 µm and was composed of removable type acrylic base PSA agent having the following blending composition.
  copolymer of butyl acrylate/2-hydroxyethyl acrylate/ acrylic acid=90/ 0.5/0.5 ratio by weight in 100 parts by weight; and
  isocyanate base cross-linking agent in 5 parts by weight
In the same manner as in Example 1, a dam frame was formed, and the resin for sealing was poured in the inside of the dam frame and cured in a curing oven. Thereafter the dam frame (PSA sheet) was removed, the surfaces of the resin for sealing were polished, and the elements were cut and separated into each unit device by means of dicing.

EXAMPLE 5

The procedure in Example 1 was repeated to prepare electronic devices except that in a PSA sheet, use was made of a hardenable PSA agent having the following blending composition.
  copolymer of butyl acrylate/methyl methacrylate/glycidyl methacrylate/2-hydroxyethyl acrylate=55/10/20/15 ratio by weight (molecular weight of 90000, approximately, glass transition temperature of minus 28° C.) in 20 parts by weight;
  liquid epoxy resin of type bisphenol A (epoxy equivalent of 180 to 200) in 30 parts by weight;
  solid epoxy resin of type bisphenol A (epoxy equivalent of 800 to 900) in 40 parts by weight;
  epoxy resin of type o-cresol novolac (epoxy equivalent of 210 to 230) in 10 parts by weight;
  dicyandiamide in one part by weight;
  2-phenyl-4, 5-hydroxyimidasole in one part by weight; and trimethlolpropane adduct of toluylene diisocyanate in 0.2 part by weight.

What is claimed is:

1. A process for producing a resin-sealed type electronic device which comprises forming a dam frame having a pressure sensitive adhesive sheet on a substrate loaded with an electronic element so as to encompass the electronic element by sticking down said pressure sensitive adhesive sheet to the substrate, pouring a resin for sealing an inside portion of the dam frame, and heat-curing the poured resin.

2. A process for producing a resin-sealed type electronic device which comprises forming a dam frame having a pressure sensitive adhesive sheet on edge and side portions of a substrate loaded with a plurality of electronic elements so as to encompass the electronic elements as a whole by sticking down said pressure sensitive adhesive sheet to the substrate, pouring a resin for sealing an inside portion of the dam frame, heat-curing the poured resin, and subsequently cutting and separating the elements into each unit electronic device by means of dicing.

3. The process for producing a resin-sealed type electronic device according to claim 2, which further comprises polishing and smoothing the surfaces of the cured resin for sealing prior to the dicing.

4. The process for producing a resin-sealed type electronic device according to claim 1, wherein said pressure sensitive adhesive sheet has a shape which substantially corresponds with the shape of the dam frame.

5. The process for producing a resin-sealed type electronic device according to claim 2, wherein said pressure sensitive adhesive sheet has a shape which substantially corresponds with the shape of the dam frame.

6. The process for producing a resin-sealed type electronic device according to claim 3, wherein said pressure sensitive adhesive sheet has a shape which substantially corresponds with the shape of the dam frame.

7. The process for producing a resin-sealed type electronic device according to claim 1, wherein the pressure sensitive adhesive sheet comprises a base material layer and a pressure sensitive adhesive layer.

8. The process for producing a resin-sealed type electronic device according to claim 2, wherein the pressure sensitive adhesive sheet comprises a base material layer and a pressure sensitive adhesive layer.

9. The process for producing a resin-sealed type electronic device according to claim 3, wherein the pressure sensitive adhesive sheet comprises a base material layer and a pressure sensitive adhesive layer.

10. The process for producing a resin-sealed type electronic device according to claim 4, wherein the pressure sensitive adhesive sheet comprises a base material layer and a pressure sensitive adhesive layer.

11. The process for producing a resin-sealed type electronic device according to claim 5, wherein the pressure sensitive adhesive sheet comprises a base material layer and a pressure sensitive adhesive layer.

12. The process for producing a resin-sealed type electronic device according to claim 6, wherein the pressure sensitive adhesive sheet comprises a base material layer and a pressure sensitive adhesive layer.

13. The process for producing a resin-sealed type electronic device according to claim 7, wherein the base material layer comprises a foamed film layer of a thermoplastic resin.

14. The process for producing a resin-sealed type electronic device according to claim 8, wherein the base material layer comprises a foamed film layer of a thermoplastic resin.

15. The process for producing a resin-sealed type electronic device according to claim 9, wherein the base material layer comprises a foamed film layer of a thermoplastic resin.

16. The process for producing a resin-sealed type electronic device according to claim 10, wherein the base material layer comprises a foamed film layer of a thermoplastic resin.

17. The process for producing a resin-sealed type electronic device according to claim 11, wherein the base material layer comprises a foamed film layer of a thermoplastic resin.

18. The process for producing a resin-sealed type electronic device according to claim 12, wherein the base material layer comprises a foamed film layer of a thermoplastic resin.

19. The process for producing a resin-seal type electronic device according to claim 7, wherein said pressure sensitive adhesive layer comprises at least one of a pressure sensitive adhesive agent selected from the group consisting of an acrylic base, a rubber base, a silicon base, a polyurethane base and a base selected from said group and which is blended with a thermosetting resin.

20. A process for producing a resin-seal type electronic device which comprises forming a dam frame on edge and side portions of a substrate loaded with a plurality of electronic components so as to encompass the electronic components as a whole by sticking down a pressure sensitive sheet to the substrate, pouring a resin for sealing an inside portion of the dam frame, heat-curing the poured resin, subsequently cutting and separating the elements into each unit electronic device by means of dicing and polishing and smoothing the surfaces of the cured resin for sealing prior to the dicing.

* * * * *